(12) United States Patent
Harada et al.

(10) Patent No.: US 6,402,508 B2
(45) Date of Patent: Jun. 11, 2002

(54) HEAT AND COOLING TREATMENT APPARATUS AND SUBSTRATE PROCESSING SYSTEM

(75) Inventors: Koji Harada; Issei Ueda, both of Kumamoto (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/729,714

(22) Filed: Dec. 6, 2000

(30) Foreign Application Priority Data

Dec. 9, 1999 (JP) .......................................... 11-350156

(51) Int. Cl.$^7$ ................................................. F27D 3/12
(52) U.S. Cl. ........................ 432/239; 118/719; 118/724
(58) Field of Search .......................... 432/239; 118/719, 118/724, 725; 438/715; 414/217, 222, 937, 940

(56) References Cited

U.S. PATENT DOCUMENTS

| | | | |
|---|---|---|---|
| 5,254,170 A | * 10/1993 | Devilbiss et al. | 118/725 |
| 5,609,689 A | * 3/1997 | Kato et al. | 118/724 |
| 6,143,083 A | * 11/2000 | Yonemitsu et al. | 414/217 |
| 6,224,274 B1 | * 5/2001 | Matsuyama | 414/937 |
| 6,235,634 B1 | * 5/2001 | White et al. | 118/719 |

* cited by examiner

Primary Examiner—Gregory Wilson
(74) Attorney, Agent, or Firm—Rader, Fishman & Grauer, PLLC (57) ABSTRACT

The present invention is an apparatus for performing heat and cooling treatments for a substrate includes: a heating table for mounting the substrate thereon to perform the heat treatment for the substrate; a cooling table for mounting the substrate thereon to perform the cooling treatment for the substrate; a waiting table for allowing the substrate to wait; a carrying mechanism for carrying the substrate between the heating table, the cooling table, and the waiting table; and airflow formation means for forming airflow in a space in which the heating table, the cooling table, and the waiting table are arranged.

10 Claims, 6 Drawing Sheets

HEAT AND COOLING TREATMENT APPARATUS AND SUBSTRATE PROCESSING SYSTEM

BACKGROUND OF THE INVENTION

1. Field of the Invention

The present invention relates to a heat and cooling treatment apparatus and a substrate processing system.

2. Description of the Related Art

In the semiconductor device fabrication processes, a photolithography process is performed for a front face of a substrate, for example, a semiconductor wafer (hereinafter, referred to as "wafer") and the like. In this photolithography process, a series of treatments is performed, in which a predetermined pattern is exposed after a resist solution is applied to the front face of the wafer, and thereafter developing treatment is performed.

In the coating and developing treatments, after the resist coating, exposure, developing treatments as above, treatments of heating the wafer are performed as required, and thereafter treatments of cooling the wafer which has increased in temperature are performed. Further, the coating and developing system for performing the coating and developing treatments is provided with various kinds of treatment units for performing these treatments individually, and the wafer is carried into/out of each unit by a main carrier unit having an arm and the like.

Figure 6:
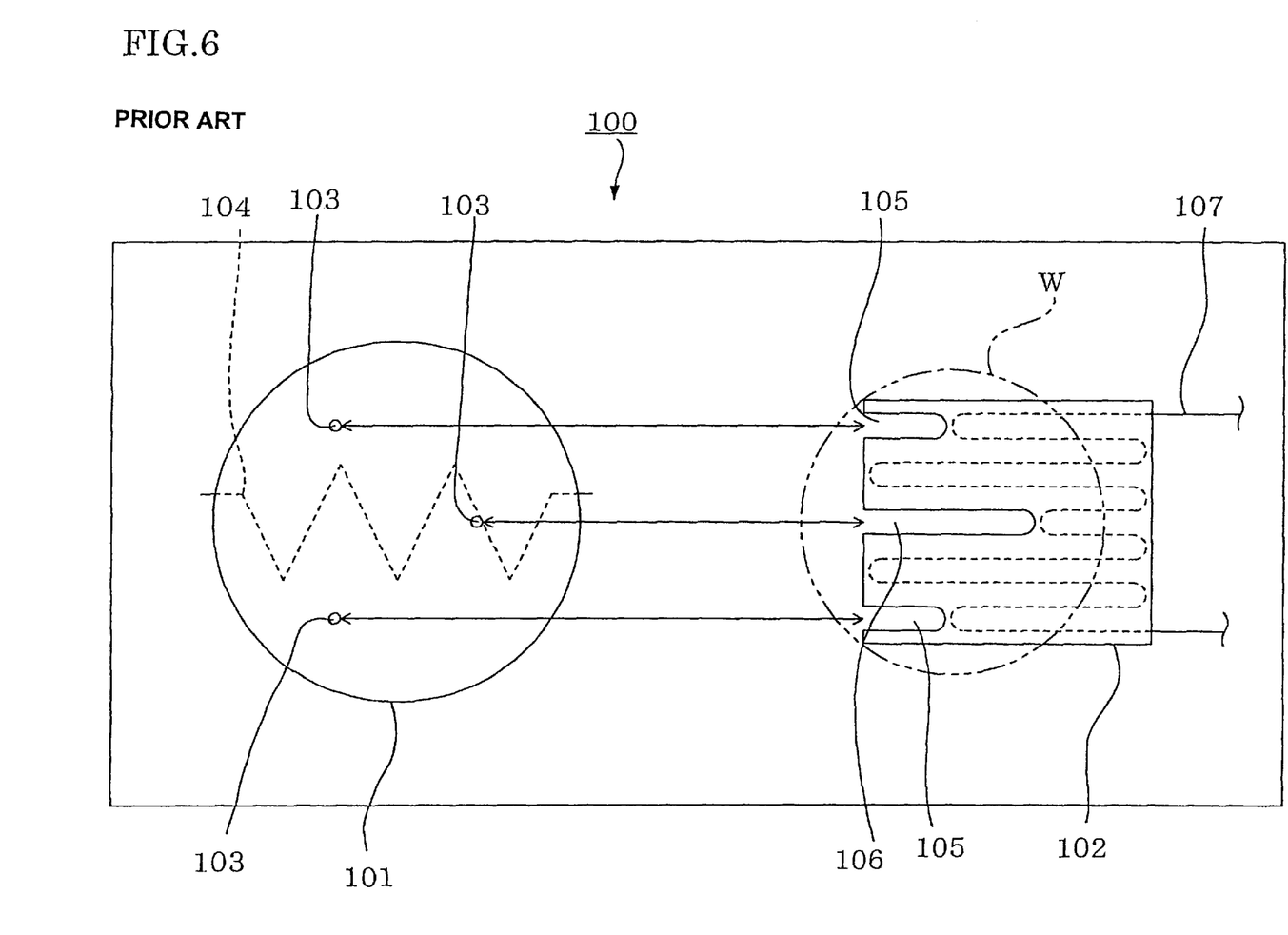
FIG. 6 is a plan view schematically showing the internal structure of a conventional heat and cooling treatment unit.

The heat treatment is usually performed in a heat treatment unit. As shown in FIG. 6, a heat treatment unit 100 is provided with a heating table 101 and a cooling arm 102. The heating table 101 mounts the wafer W thereon by means of support pins 103, 103, and 103 which are provided on the top face of the heating table 101, and performs heat treatment for the wafer W by heat generated by a heater 104 embedded in the heating table 101. On the other hand, the cooling arm 102 forms a substantially square flat plate shape and is configured to be movable forward and backward with respect to the heating table 101 by means of a drive mechanism not shown and to receive the wafer W which has been subjected to the heat treatment from the heating table 101. When receiving the wafer, the cooling arm 102 does not contact the support pins 103 by virtue of slits 105, 105, and 106 which are formed in the cooling arm 102. Furthermore, a circulation passage 107 is formed inside the cooling arm 102. The circulation passage 107 is connected to a constant temperature water supply source (not shown) to circulate a constant temperature water with a temperature of, for example, 23° C. Therefore, the cooling arm 102 allows the wafer W to wait which has been subjected to the heat treatment until it is carried out of the unit to perform simple pre-cooling treatment, thereby causing the wafer W to decrease in temperature to some extent.

In the cooling treatment unit, a cooling table is provided. The cooling table mounts thereon the wafer W which has been subjected to the pre-cooling treatment, performs precise cooling treatment by a Peltier element embedded in the cooling table to thereby bring the wafer to a predetermined temperature (for example, 23° C.).

SUMMARY OF THE INVENTION

However, in the conventional heat treatment unit 100, when the wafer W is mounted on the cooling arm 102, portions of the rear face of the wafer corresponding to the slits 105, 105, and 106 are not in contact with the cooling arm 102. Therefore, the non-contact portions of the rear face of the wafer and portions of the front face of the wafer opposing to the portions of the rear face of the wafer are often low in temperature reduction as compared with other portions of the front and rear faces of the wafer. Further, when the cooling arm 102 is not large enough to mount the wafer W thereon, there exist portions which lie off the cooling arm 102, and the lying-off portions of the front and rear faces of the wafer are also low in temperature reduction. Moreover, it happens that the timing of carrying the wafer W out of the heat treatment unit 100 is delayed, prolonging the waiting period of the wafer in the cooling arm 102. For this reason, there are some cases where cooling effects on the wafers W by the cooling arm 102 are different. Also ununiformity in in-plane temperature distribution and unevenness in cooling effect, which are almost negligible before, have room for improvement in order to realize more precise fabrication technology in response to progression of micromachining technology.

When the chemically amplified resist is used, in post-exposure bake (PEB) which is heat treatment after exposure, it is necessary to promptly shift the wafer W, after the pre-cooling treatment similarly by the cooling arm 102, to precise cooling treatment to prevent deformation and deterioration in reproduction of a pattern due to amplification reaction of acid. However, since conventionally the heat treatment unit 100 and the cooling treatment unit are provided separately, it takes time to carry the wafer W out of the heat treatment unit 100 into the cooling treatment unit. In these days when patterns become minuter, the moving period of the wafer W between the units, which has been insignificant conventionally, is susceptible to causing deformation and deterioration in reproduction of the patterns, and therefore there is room for improvement also on the point of the moving period of the wafer W.

The present invention is made in the above viewpoints, and its object is to provide new treatment apparatus and substrate processing system capable of making in-plane temperature distribution of a substrate and cooling effects uniform and shifting to precise cooling treatment more promptly than before.

The present invention is an apparatus for performing heat and cooling treatments for a substrate includes a heating table for mounting the substrate thereon to perform the heat treatment for the substrate, a cooling table for mounting the substrate thereon to perform the cooling treatment for the substrate, a waiting table for allowing the substrate to wait, a carrying mechanism for carrying the substrate between the heating table, the cooling table, and the waiting table, and airflow formation means for forming airflow in a space in which the heating table, the cooling table, and the waiting table are arranged.

In the heat and cooling treatment apparatus of the present invention, the cooling table has a cooling adjusting element, for example, a Peltier element or the like inside thereof so as to perform the precise cooling treatment by cooling operation of this cooling adjusting element. The heat and cooling treatment apparatus as above carries the substrate to the heating table and the cooling table in sequence by means of the carrying mechanism to perform heat and cooling treatments successively. Since the substrate is mounted on the cooling table during the cooling treatment, the cooling treatment can be performed for the entire substrate uniformly. Thus, the apparatus, in which the precise cooling treatment is performed without delay, is excellent in time management on the heat and cooling treatments. Therefore, it is possible to make in-plane temperature distribution of the substrate uniform and to make the cooling effects on substrates the same even when the cooling treatment is performed for a plurality of substrates. Further, the apparatus can conduct the shift to the precise cooling treatment more promptly than before, thereby preventing deformation and deterioration in reproduction of a pattern. Consequently, yields can be improved.

Moreover, a substrate which is an object to be processed next is allowed to wait on the waiting table in advance and substrates are carried to the heating table and the cooling table one after another, whereby heat and cooling treatments can be performed for a plurality of substrates successively. Therefore, throughput can be improved.

It is preferable that a heat treatment case for housing the heating table is provided in the heat and cooling treatment apparatus of the present invention. Further, it is preferable that a cooling treatment case for housing the cooling table is provided. In that case, the heat treatment case can prevent the thermal influence by the heating table to diffuse thereabout, and the cooling treatment case can intercept the thermal influence by the heating table exerting on the cooling table. Accordingly, the heating table and the cooling table can carry out intended treatments even if they are arranged in the same apparatus.

Further, it is more preferable that a heat insulation material for intercepting radiation heat of the heating table is provided.

Furthermore, it is preferable that the airflow formation means comprises an exhaust port formed on the heating table side, and an exhaust mechanism for exhausting through the exhaust port an atmosphere in a space in which the heating table, the cooling table, and the waiting table are arranged. In the case where the exhaust mechanism is, for example, an exhaust fan, operation of the exhaust fan can form airflow which flows from the cooling table side to the heating table side in the space. The airflow as above can prevent a hot atmosphere produced by the heating table from flowing to the cooling table side. Further, since the airflow flows from the cooling table side to the heating table side, it comes to contain a cool air, thereby instantly cooling the substrate which has been subjected to the heat treatment while carrying the substrate from the heating table to the cooling table.

Moreover, the present invention is a system for processing a substrate includes the heat and cooling treatment apparatus as above, and a solution treatment apparatus for supplying a treatment solution to the substrate to perform a predetermined treatment for the substrate, the cooling table being disposed on the solution treatment apparatus side, in the heat and cooling treatment apparatus.

In the substrate processing system, the cooling table is disposed on the side of the solution treatment apparatus, in the heat and cooling treatment apparatus. Therefore, the cooling table is interposed between the solution treatment apparatus and the heating table, with the result that the thermal influence by the heating table does not exert on the solution treatment apparatus. As a result, a predetermined solution treatment can be preferably performed for the substrate.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENT

Figure 1:
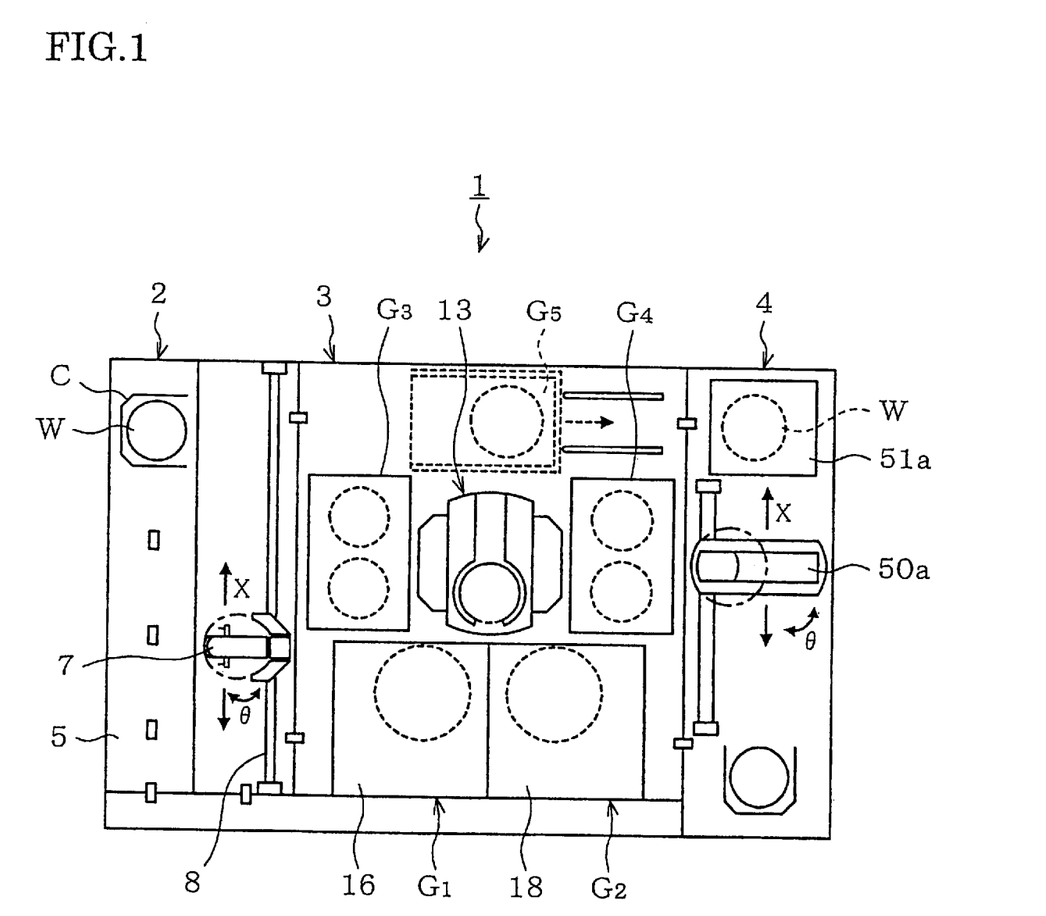
FIG. 1 is a plan view of a coating and developing system including a heat and cooling treatment unit according to an embodiment of the present invention.
Figure 2:
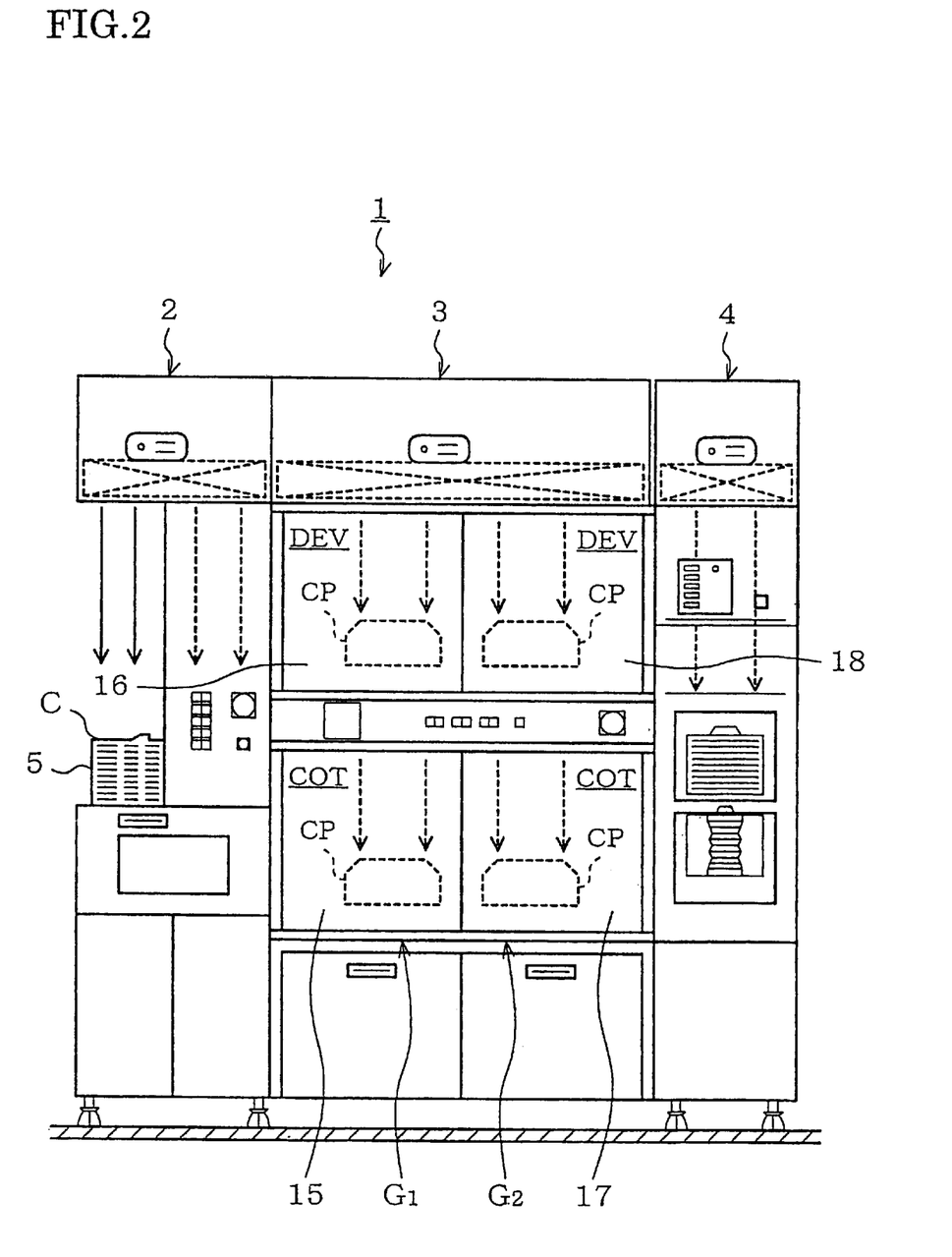
FIG. 2 is a front view of the coating and developing system according to the embodiment of the present invention.
Figure 3:
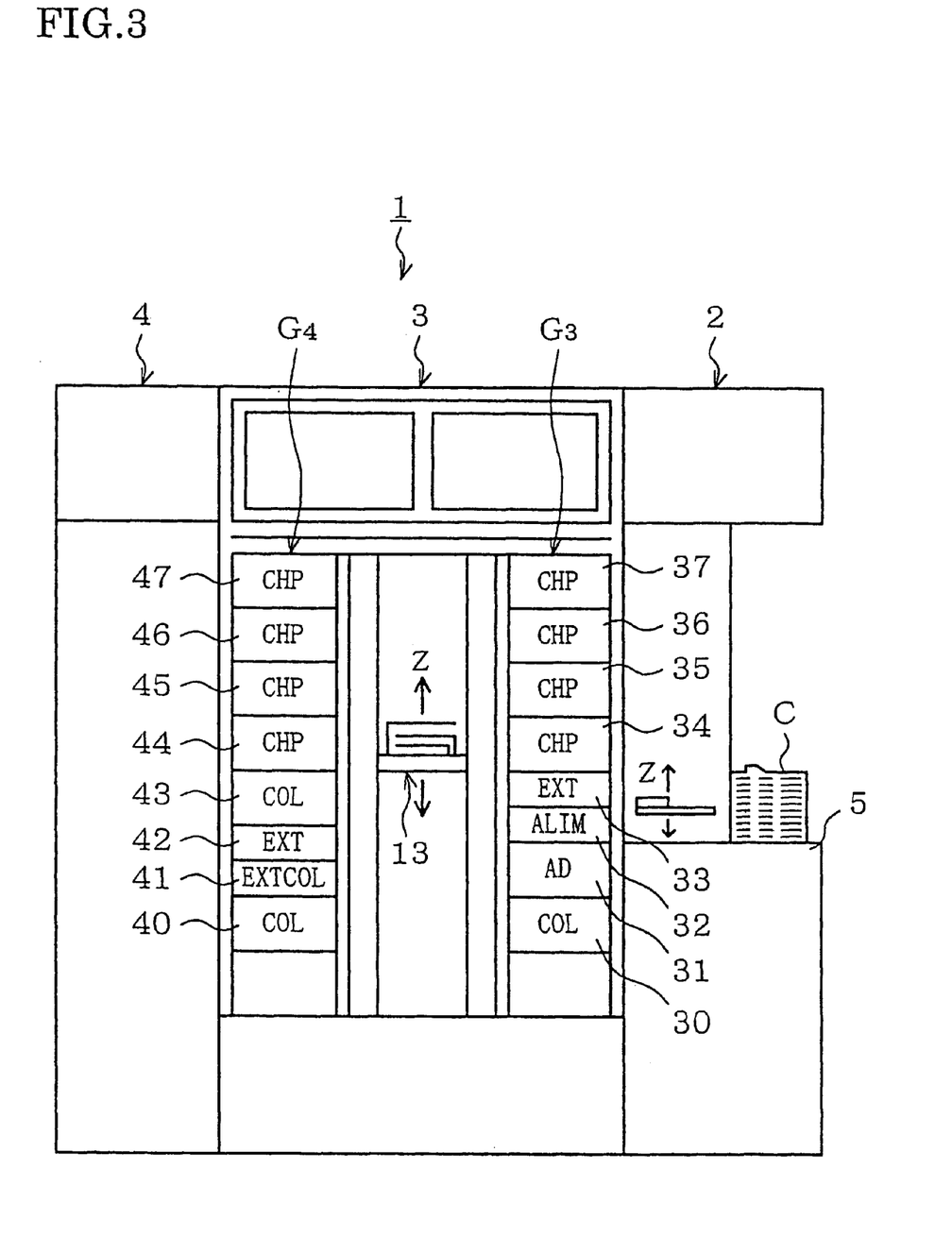
FIG. 3 is a rear view of the coating and developing system according to the embodiment of the present invention.

Hereinafter, a preferred embodiment of the present invention will be explained with reference to the drawings. FIG. 1 to FIG. 3 show the external appearance of a coating and developing system including a heat and cooling treatment unit according to this embodiment, FIG. 1, FIG. 2, and FIG. 3 show appearances of the plane, front, and back respectively.

The coating and developing system 1 has a configuration, as shown in FIG. 1, in which a cassette station 2 for carrying a cassette C housing, for example, 25 wafers W from/to the outside into/out of the coating and developing system 1 and carrying the wafer W into/out of the cassette C, a processing station 3 in which various kinds of processing and treatment units each for performing predetermined processing or treatment for the wafers W one by one are arranged, and an interface section 4 for receiving and delivering the wafer W between the processing station 3 and an aligner (not shown), are integrally connected.

In the cassette station 2, a plurality of cassettes C can be mounted at predetermined positions on a cassette mounting table 5 which is a mounting portion in a line in an X-direction (a vertical direction in FIG. 1). A wafer carrier 7 transportable in the direction of arrangement of the cassettes (the X-direction) and in the direction of arrangement of the wafers W housed in the cassette C (a Z-direction; a vertical direction) is provided to be movable along a carrier guide 8 so as to selectively get access to each cassette C.

The wafer carrier 7 is configured to get access also to an alignment unit 32 and an extension unit 33 included in a third processing unit group $G_3$ on the processing station 3 side as described later.

In the processing station 3, a main carrier unit 13 is provided at the central portion thereof, and various kinds of processing and treatment units are multi-tiered around the main carrier unit 13 to form processing unit groups. In the coating and developing system 1, four processing unit groups $G_1$, $G_2$, $G_3$, and $G_4$ are arranged, the first and second processing unit groups $G_1$ and $G_2$ are disposed on the front side of the coating and developing system 1, the third processing unit group $G_3$ is disposed adjacent to the cassette station 2, and the fourth processing unit group $G_4$ is disposed adjacent to the interface section 4. Further, a fifth processing unit group $G_5$ shown by a broken line can be additionally disposed on the rear side as an option.

In the first processing unit group $G_1$, as shown in FIG. 2, two kinds of spinner-type solution treatment units, for example, a resist coating unit 15 for supplying a resist solution to the wafer W to thereby treat it and a developing unit 16 for supplying a developing solution to the wafer W to thereby treat it are two-tiered from the bottom in order. Similarly in the second processing unit group $G_2$, a resist coating unit 17 and a developing unit 18 are two-tiered from the bottom in order.

In the third processing unit group $G_3$, for example, as shown in FIG. 3, a cooling unit 30 for performing cooling treatment for the wafer W, an adhesion unit 31 for enhancing fixedness between a resist solution and the wafer W, the alignment unit 32 for aligning the wafer W, the extension unit 33 for allowing the wafer to wait therein, heat and cooling treatment units 34, 35, 36, and 37 according to the embodiment of the present invention, and the like are, for example, eight-tiered from the bottom in order.

In the fourth processing unit group $G_4$, for example, a cooling unit 40, an extension and cooling unit 41 for allowing the wafer W mounted thereon to cool by itself, an extension unit 42, a cooling unit 43, heat and cooling treatment units 44, 45, 46, and 47, and the like are, for example, eight-tiered from the bottom in order.

A wafer carrier 50*a* is provided at the central portion of the interface section 4. The wafer carrier 50*a* is configured to get access to the extension and cooling unit 41 and the extension unit 42 included in the fourth processing unit group $G_4$, a peripheral aligner 51*a*, and the aligner (not shown).

The heat and cooling treatment units 34 to 37 and 44 to 47 can be variously set in accordance with treatment purposes. For example, setting is made such that the heat and cooling treatment units 34 and 35 perform prebake (PREBAKE), which is heat treatment after resist coating, and cooling treatment after the prebake, the heat and cooling treatment units 44 and 45 perform post-exposure bake (PEB), which is heat treatment after exposure processing, and cooling treatment after the post-exposure bake, and the heat and cooling treatment units 36, 37, 46, and 47 perform postbake (POBEBAKE), which is heat treatment after developing treatment, and cooling treatment after the postbake. All of the heat and cooling treatment units 34 to 37 and 44 to 47 have the same structure, and thus description will be presented here taking the heat and cooling treatment unit 44 as an example for description.

Figure 4:
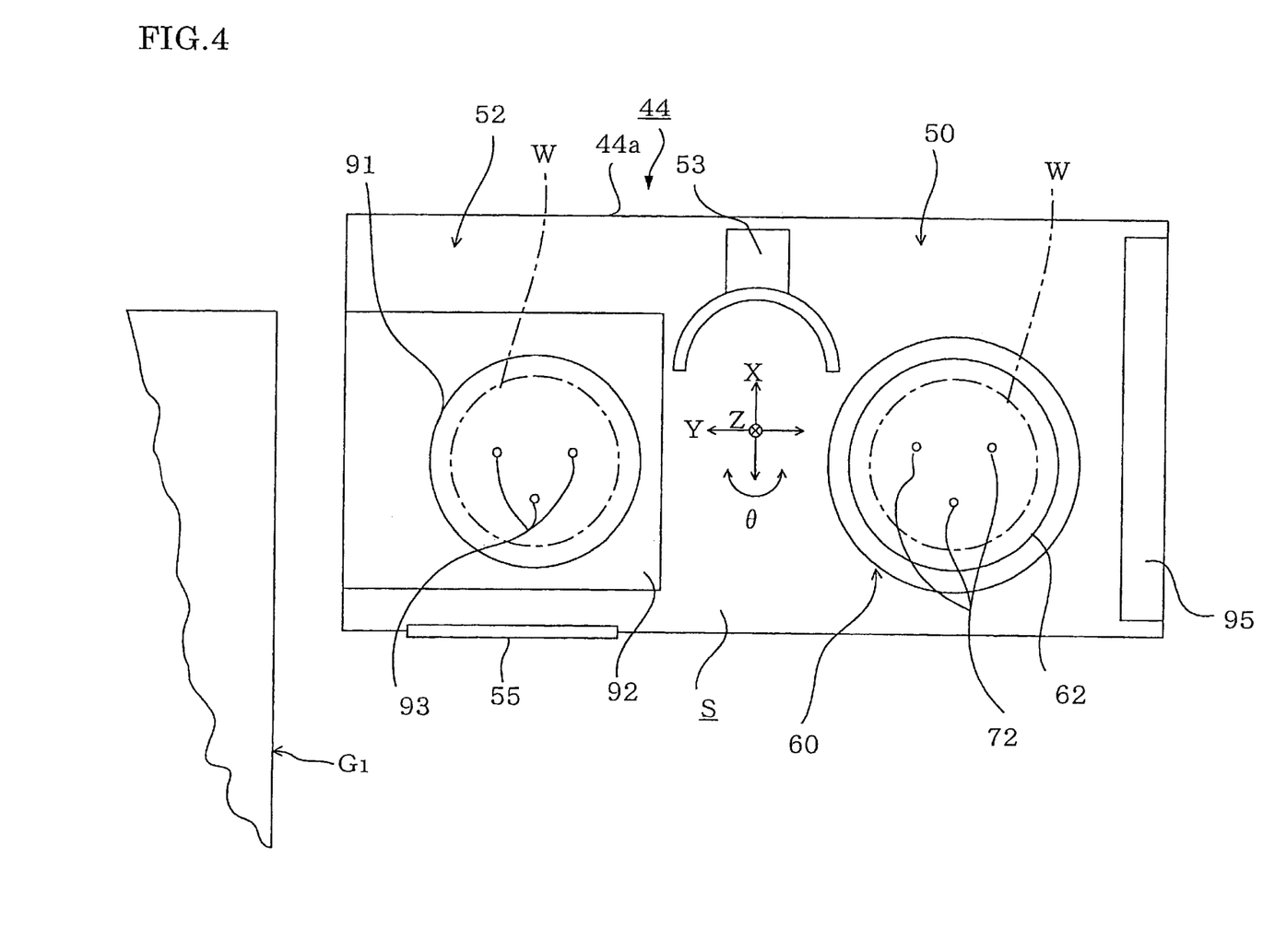
FIG. 4 is a plan view schematically showing the internal structure of the heat and cooling treatment unit according to the embodiment of the present invention.
Figure 5:
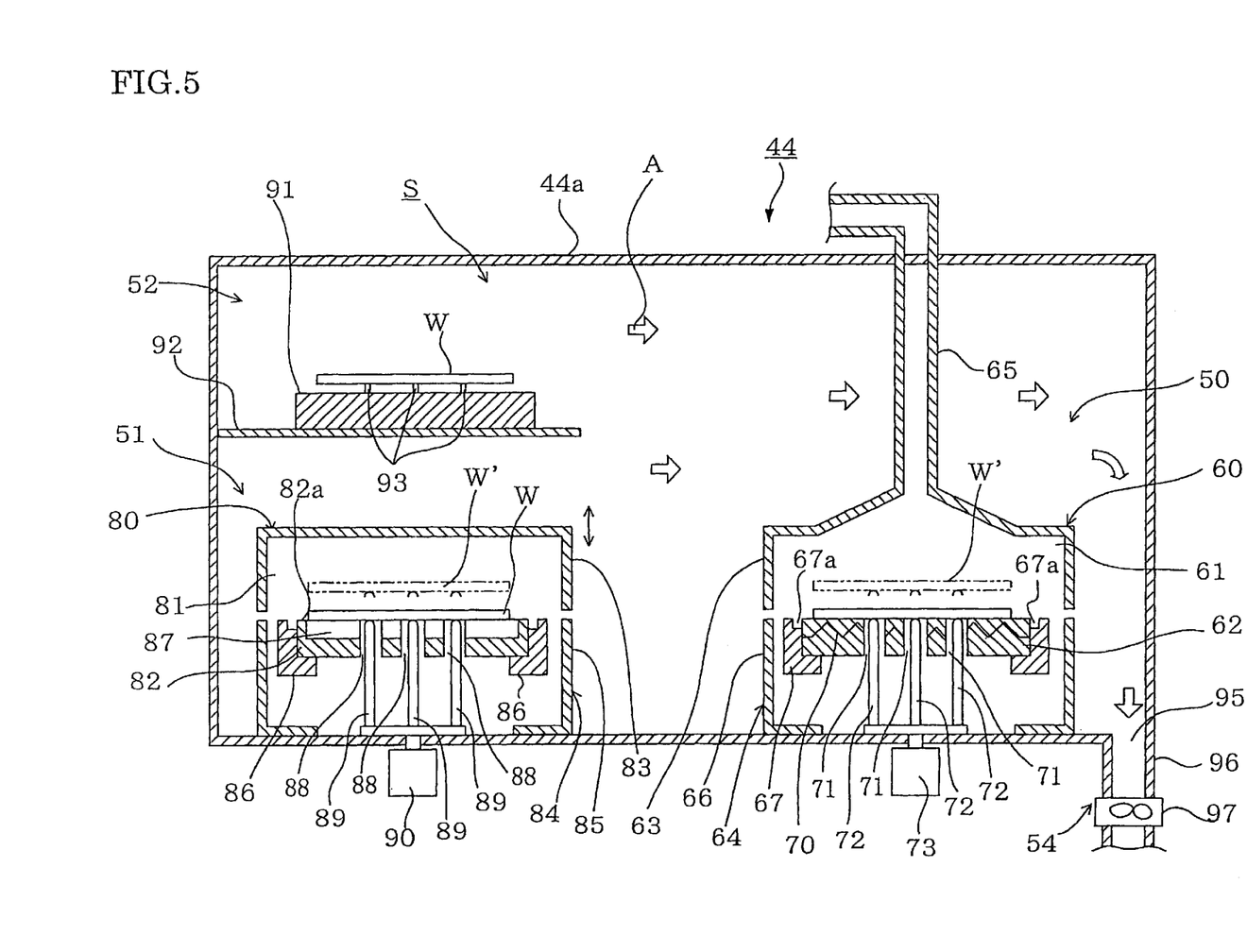
FIG. 5 is a sectional view schematically showing the internal structure of the heat and cooling treatment unit according to the embodiment of the present invention.

As shown in FIG. 4 and FIG. 5, a heating portion 50 for performing heat treatment for the wafer W, a cooling portion 51 for performing cooling treatment for the wafer W, a waiting portion 52 for allowing the wafer W to wait therein, a unit arm 53 for carrying the wafer W, and an airflow formation means for forming airflow A, are provided in a casing 44*a* of the heat and cooling treatment unit 44. The waiting portion 52 is disposed above the cooling portion 51, a carry-in port 55 for carrying in the wafer W is formed in a side face of the casing 44*a* on the forward side (on the lower side in FIG. 4) of the waiting portion 52, and a carry-out port (not shown) for carrying out the wafer W is formed in a side face of the casing 44*a* on the forward side of the cooling portion 51.

The heating portion 50 includes a heat treatment case 60. In the heat treatment case 60, a heat treatment chamber 61, in which heat treatment is performed for the wafer W, is formed, and a heating table 62 is installed. The heating table 62 is configured to mount the wafer W thereon to perform heat treatment for the wafer W to a predetermined temperature.

The heat treatment case 60 has a heat cover 63 located on the upper side and vertically movable and a heating table housing portion 64. The heat cover 63 has a substantially cone shape that gradually increases in height toward the center thereof, and its summit portion is connected with an exhaust pipe 65. Accordingly, an atmosphere in the heat treatment chamber 61 is uniformly exhausted through the exhaust pipe 65. Further, the heat cover 63 covers the heating table 62 to prevent a hot atmosphere from diffusing thereabout.

The heating table housing portion 64 has a substantially cylindrical case 66 and a support ring 67 for holding the heating table 62. The support ring 67 is made of a material having good heat insulating properties to insulate radiation heat produced by the heating table 62. Further, the support ring 67 is provided with blow-out ports 67*a,* thereby blowing out, for example, nitrogen gas ($N_2$ gas) or the like as an inert gas into the heat treatment chamber 61.

The heating table 62 is made, for example, circular in plane form. In the heating table 62, a heater 70 is embedded and three through holes 71 are provided. Raising and lowering pins 72 for supporting the rear face of the wafer W are inserted in the through holes 71 respectively. These three raising and lowering pins 72 are vertically moved by means of a raising and lowering mechanism 73. Accordingly, the wafer W supported by the raising and lowering pins 72 can be raised and lowered between a heating position shown by a solid line W and a delivery position shown by a two-dotted chain line W' in the heat treatment chamber 61.

The cooling portion 51 has a cooling treatment case 80. In the cooling treatment case 80, a cooling treatment chamber 81, in which cooling treatment is performed for the wafer W, is formed, and a cooling table 82 is installed. The cooling table 82 is configured to mount the wafer W thereon to perform cooling treatment for the wafer W to a predetermined temperature.

The cooling treatment case 80 has a cooling cover 83 located on the upper side and vertically movable and a cooling table housing portion 84. The cooling cover 83 has a substantially cylindrical shape. On the other hand, the cooling table housing portion 84 has a case 85 and a support ring 86 for holding the cooling table 82.

The cooling table 82 is made circular in plane form and has a diameter larger than that of the wafer W. Therefore, the cooling table 82 has a mounting face 82*a* which can mount the wafer W thereon with contacting the entire wafer. Furthermore, the cooling table 82 includes a Peltier element 87, thereby performing precise cooling treatment by cooling operation of the Peltier element 87. Raising and lowering pins 89 are inserted in three through holes 88 respectively and vertically moved by means of a raising and lowering mechanism 90. Accordingly, the wafer W supported by the raising and lowering pins 89 can be raised and lowered between a cooling position shown by a solid line W and a delivery position shown by a two-dotted chain line W' in the cooling treatment chamber 81.

The location of the heating portion 50 is set on the rear face side of the coating and developing system 1 (on the right-hand side in FIG. 5), and that of the cooling portion 51 is set on the front side of the coating and developing system 1 (on the left-hand side in FIG. 5). This results in that, as shown in FIG. 4 and FIG. 5, the heating table 62 is disposed on the opposite side to the resist coating unit 15 and the developing unit 16 (the first processing unit group $G_1$), in the heat and cooling treatment unit 44, and the cooling table 82 is disposed on the side of the resist coating unit 15 and the developing unit 16, in the heat and cooling treatment unit 44.

The waiting portion 52 has a waiting table 91. The waiting table 91 is installed on a plate 92 which is firmly fixed to the casing 44a in a horizontal position. The waiting table 92 is made, for example, circular in plane form, and three support pins 93 are provided on the top face thereof. Accordingly, the waiting table 91 is configured to mount the wafer W thereon in a horizontal position with the rear face of the wafer W being supported by these support pins 93.

The airflow formation means 54 includes an exhaust port 95 which is formed at an end portion of the bottom face of the casing 44a on the heating portion 50 side, and an exhaust fan 97 which is provided on an exhaust pipe 96 which is connected to the exhaust port 95. The exhaust fan 97 is configured to exhaust an atmosphere in a space S in which the heating table 62, the cooling table 82, and the waiting table 91 are arranged, so that operation of the exhaust fan 97 forms the aforesaid airflow A which flows from the cooling table 82 side to the heating table 62 side. In the heat treatment case 60, when the heat cover 63 is opened, the hot atmosphere produced by the heating table 62 is immediately sucked into the exhaust port 95. Meanwhile, in the cooling treatment case 80, when the cooing cover 83 is opened, a cooling air produced by the cooling table 82 diffuses in the casing 44a. Thus, the airflow A includes a cooling air capable of cooling the wafer.

As shown in FIG. 4, the unit arm 53 is movable in horizontal directions (X- and Y-directions in FIG. 4), ascendable and descendable in a vertical direction (a Z-direction in FIG. 4), and further rotatable (a θ-direction in FIG. 4). The unit arm 53 is configured to carry the wafer W between the heating table 62, the cooling table 82, and the waiting table 91.

The heat and cooling treatment unit 44 according to this embodiment is configured as above, and next the operation and the like thereof will be explained. First, the exhaust fan 97 operates to form the airflow A in the heat and cooling treatment unit 44. Then, the wafer W for which exposure processing has been completed in the aligner is carried into the heat and cooling treatment unit 44 included in the fourth processing unit group $G_4$.

The wafer W which has been carried in is mounted on the waiting table 91 of the waiting portion 52. Thereafter, the wafer W is carried to the heating portion 50 by the unit arm 53. The heat cover 63 is opened, and the wafer W is mounted on the heating table 62. The wafer W is heated to, for example, 200° C. on the heating table 62. Since the heat cover 63 is closed during the heating, the hot atmosphere in the heat treatment chamber 61 never diffuses into the casing 44a.

Meanwhile, the waiting table 91 becomes unoccupied, and thus a second wafer W for which exposure processing has been completed is carried in and mounted thereon. Thereafter, when a predetermined period of time (for example, 90 seconds) has elapsed and heat treatment has been completed, the heat cover 63 is opened, and the unit arm 53 receives the wafer W from the heating table 62 and immediately carries it to the cooling table 82 of the cooling portion 51. In this event, since the airflow A flows from the cooling table 82 side to the heating table 62 side, the hot atmosphere produced by the heating table 62 can be prevented from flowing to the cooling table 82 side. Thus, the hot atmosphere is exhausted from the exhaust port 95.

The wafer W mounted on the cooling table 82 is cooled to, for example, 23° C. (room temperature) by the cooling operation of the Peltier element 87. Meanwhile, the heating table 62 becomes unoccupied, and thus the second wafer W is carried thereto to be subjected to heat treatment in succession. Further, the waiting table 91 becomes unoccupied, and thus a third wafer W for which exposure processing has been completed is carried in and mounted thereon. Thereafter when, for example, a predetermined period of time (for example, 60 seconds) and cooling treatment has been completed, the wafer W is carried out of the heat and cooling treatment unit 44. On the other hand, when heat treatment has been completed for the second wafer W on the heating table 62, the second wafer W is shifted to cooling treatment and the third wafer W is shifted to heat treatment respectively. Further, a fourth wafer W is mounted on the waiting table 91, and thereafter the same heat and cooling treatments follow.

By means of the above-described heat and cooling treatment unit 44, the wafer W is carried to the heating table 62 and the cooling table 82 in sequence by the unit arm 53 to be subjected to heat and cooling treatments successively. Since the wafer W is mounted on the cooling table 82 during cooling treatment here, cooling treatment can be performed for the entire wafer uniformly. Furthermore, the heat and cooling treatment unit 44, in which conventional pre-cooling treatment can be omitted and precise cooling treatment can be performed without delay, is excellent in time management on heat and cooling treatments. Therefore, it is possible to make in-plane temperature distribution of the wafer W uniform, and to make the cooling effects for wafers W the same even when heat and cooling treatments are performed for a plurality of wafers W. As a result, precise fabrication technology can be realized, whereby it becomes possible to sufficiently cope with minuter semiconductor devices and high integration thereof.

Moreover, the cover 63 is opened after the heat treatment to thereby expose the wafer W in the casing 44a, allowing the wafer W to contact the airflow A. The airflow A here contains the cool air, which has diffused from within the cooling treatment chamber 81, can cool the wafer W instantly. Especially when a chemically amplified resist, which is sensitive to temperature change, is used, it is necessary to decrease the temperature of the wafer W promptly to a temperature at which the amplification reaction of the resist does not proceed, after the post-exposure bake (PEB) which is heat treatment after the exposure processing. The heat and cooling treatment unit 44 conducts, in response to the need as above, the shift to the precise cooling treatment more promptly than before, thereby preventing deformation and deterioration in reproduction of a pattern. Consequently, yields can be improved.

The heating table 62 is installed in the heat treatment case 60, and the cooling table 82 is installed in the cooling treatment case 80. Therefore, the heat treatment case 60 can prevent thermal influence by the heating table 62 to diffuse thereabout, and the cooling treatment case 80 can intercept the thermal influence by the heating table 62 exerting on the cooling table 82. Furthermore, the support ring 67 can intercept the radiation heat produced by the heating table 62. Accordingly, the heating table 62 and the cooling table 82 can carry out intended treatments even if they are arranged in the same unit.

Moreover, a wafer W which is an object to be processed next is allowed to wait on the waiting table 91 in advance and wafers W are carried to the heating table 62 and the cooling table 82 one after another, whereby heat and cooling treatments can be performed for a plurality of wafers W successively. Therefore, throughput can be improved.

Further, the heating table 62 is disposed on the opposite side to the side of the resist coating unit 15 and the developing unit 16, and the cooling table 82 is disposed on the side of the resist coating unit 15 and the developing unit 16 (the first processing unit group G₁). Therefore, the cooling unit 82 is interposed between the resist coating unit 15 and the developing unit 16 and the heating table 62, with the result that the thermal influence by the heating table 62 does not exert on the resist coating unit 15 and the developing unit 16. As a result, resist coating and developing treatment can be preferably performed for the wafer W.

Though the example, in which the thermal influence by the heating table 62 is intercepted by the heat treatment case 60 and the support ring 67, has been described in this embodiment, the present invention is not limited to this example. It is also suitable to provide, for example, a heat insulation shutter, which is vertically movable, between the heating table 62 and the cooling table 82 so that the radiation heat of the heating table 62 is intercepted by means of the heat insulation shutter.

It is also suitable to provide not only the exhaust fan 97 on the heating table 62 side but also a blower on the cooling table 82 side to form the airflow A by the blower and the exhaust fan 97. Further, it is also suitable to provide a plurality of unit arms 53 so that carriage of the wafer from the waiting table 91 to the heating table 62 and carriage of the wafer from the heating table 62 to the cooling table 82 are concurrently performed to improve throughput further.

Since the heat and cooling treatment units 34 to 37 and 45 to 47 also have the same structure as that of the heat and cooling treatment unit 44, the same operations and effects can be obtained, not only in the heat and cooling treatments after the exposure, but also in the heat and cooling treatments after the resist coating and the heat and cooling treatments after the developing treatment. Furthermore, the description is presented taking an example in which a wafer W is used as a substrate, but the present invention is not limited to this example but can be provided in the case in which, for example, an LCD substrate is used.

The present invention is not limited to the embodiment which has been previously described. The aforesaid embodiment is presented for facilitating the understanding of the present invention, and therefore the scope of the present invention is not limited by the embodiment, but various modifications, changes, and the like may be made with the spirit of the present invention.

What is claimed is:

1. An apparatus for performing heat and cooling treatments for a substrate, comprising:
    a casing having an inside region, said casing comprising:
    a heating table for mounting the substrate thereon to perform the heat treatment for the substrate;
    a cooling table for mounting the substrate thereon to perform the cooling treatment for the substrate;
    a waiting table for allowing the substrate to wait;
    a carrying mechanism for carrying the substrate between said heating table, said cooling table, and said waiting table; and
    airflow formation means for forming airflow in a space in which said heating table, said cooling table and said waiting table are arranged;
    wherein the heating table, the cooling table, the waiting table, the carrying mechanism and the airflow formation means are all located inside said inside region of said casing; and
    wherein the carrying mechanism is for use exclusively within said inside region of said casing.

2. A heat and cooling treatment apparatus as set forth in claim 1,
    wherein a heat treatment case for housing said heating table is provided.

3. A system for processing a substrate, comprising:
    said heat and cooling treatment apparatus in claim 2; and
    a solution treatment apparatus for supplying a treatment solution to the substrate to perform a predetermined treatment for the substrate,
    said cooling table being disposed on said solution treatment apparatus side, in said heat and cooling treatment apparatus.

4. A heat and cooling treatment apparatus as set forth in claim 1,
    wherein a cooling treatment case for housing said cooling table is provided.

5. A system for processing a substrate, comprising:
    said heat and cooling treatment apparatus in claim 4; and
    a solution treatment apparatus for supplying a treatment solution to the substrate to perform a predetermined treatment for the substrate,
    said cooling table being disposed on said solution treatment apparatus side, in said heat and cooling treatment apparatus.

6. A heat and cooling treatment apparatus as set forth in claim 1, wherein a heat insulation material for insulating radiation heat of said heating table is provided.

7. A system for processing a substrate, comprising:
    said heat and cooling treatment apparatus in claim 6; and
    a solution treatment apparatus for supplying a treatment solution to the substrate to perform a predetermined treatment for the substrate,
    said cooling table being disposed on said solution treatment apparatus side, in said heat and cooling treatment apparatus.

8. A heat and cooling treatment apparatus as set forth in claim 1,
    wherein said airflow formation means comprises an exhaust port formed on said heating table side, and an exhaust mechanism for exhausting through the exhaust port an atmosphere in a space in which said heating table, said cooling table, and said waiting table are arranged.

9. A system for processing a substrate, comprising:
    said heat and cooling treatment apparatus in claim 8; and
    a solution treatment apparatus for supplying a treatment solution to the substrate to perform a predetermined treatment for the substrate,
    said cooling table being disposed on said solution treatment apparatus side, in said heat and cooling treatment apparatus.

10. A system for processing a substrate, comprising:
    said heat and cooling treatment apparatus in claim 1; and
    a solution treatment apparatus for supplying a treatment solution to the substrate to perform a predetermined treatment for the substrate,
    said cooling table being disposed on said solution treatment apparatus side, in said heat and cooling treatment apparatus.

* * * * *